(12) United States Patent
Cliff et al.

(10) Patent No.: US 6,232,893 B1
(45) Date of Patent: May 15, 2001

(54) METHOD AND APPARATUS FOR PROGRAMMABLY PROVIDING A POWER SUPPLY VOLTAGE TO AN INTEGRATED CIRCUIT

(75) Inventors: Richard Cliff, Milpitas; Robert Bielby, Pleasanton, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/311,208

(22) Filed: May 12, 1999

Related U.S. Application Data

(60) Provisional application No. 60/086,910, filed on May 27, 1998.

(51) Int. Cl.[7] ................................................... H03M 7/00
(52) U.S. Cl. ............................................ 341/78; 323/304
(58) Field of Search .............................. 341/78; 323/304; 326/80

(56) References Cited

U.S. PATENT DOCUMENTS

| | | | |
|---|---|---|---|
| 5,570,005 | * 10/1996 | Hardee et al. | 323/314 |
| 5,661,685 | * 8/1997 | Lee et al. | 365/185.2 |
| 5,727,208 | * 3/1998 | Brown | 395/653 |
| 5,790,469 | * 8/1998 | Wong | 365/226 |
| 5,815,445 | * 9/1998 | Hull et al. | 365/189.06 |

OTHER PUBLICATIONS

Bursky, Dave, "Combination RAM/PLD Opens New Application Options", Electronic Design, pp. 138–140, May 23, 1991.

Intel Corporation "10 ns FLEXlogic FPGA with SRAM Option", Intel®,iFX780, pp. 2–24–2–46, Nov. 1993.

Ngai, Tony Kai–Kit, "An SRAM–Programmable Field–Reconfigurable Memory", Department of Electrical Engineering, University of Toronto, Thesis for Master of Applied Science, 1994.

Altera Corporation APEX 20K Programmable Logic Device Family, ALTERA®, Oct. 1998, ver.1.

* cited by examiner

Primary Examiner—Peguy Jean Pierre
(74) Attorney, Agent, or Firm—Beyer Weaver & Thomas LLP

(57) ABSTRACT

The invention relates to programmable voltage regulator that programmably provides a desired operating voltage to a power pin based upon operating voltage configuration data. The programmable voltage regulator includes an operating voltage configuration data decoder arranged to decode the operating voltage configuration data. The programmable voltage regulator also includes a programmable voltage down converter connected to the operating voltage configuration data decoder. The programmable voltage down converter uses the decoded operating voltage configuration data to convert the first voltage to the desired operating voltage which is then output to the power pin.

17 Claims, 7 Drawing Sheets

METHOD AND APPARATUS FOR PROGRAMMABLY PROVIDING A POWER SUPPLY VOLTAGE TO AN INTEGRATED CIRCUIT

CROSS REFERENCE TO RELATED APPLICATION

This application claims benefit of priority under 35 U.S.C. §119(e) of U.S. Provisional Application Ser. No.60/086,910, filed May 27, 1998, which is hereby incorporated by reference.

BACKGROUND OF THE INVENTION

1. Field of the Invention

This invention relates generally to memory used to configure a programmable integrated circuit and specifically a configuration memory having a programmable voltage regulator.

2. Description of the Related Art

A programmable logic device (PLD) is a programmable integrated circuit that allows the user of the circuit, using software control, to customize the logic functions the circuit will perform. The logic functions previously performed by small, medium, and large scale integration integrated circuits can instead be performed by programmable logic devices. When a typical programmable logic device is supplied by an integrated circuit manufacturer, it is not yet capable of performing any specific function. The user, in conjunction with software supplied by the manufacturer or created by the user or an affiliated source, can configure the PLD to perform the specific function or functions required by the user's application. Typically, a configuration memory includes information in the form of stored configuration data bits to configure the PLD. The PLD then can function in a larger system designed by the user just as though dedicated logic chips were employed. For the purpose of this description, it is to be understood that a programmable logic device refers to once programmable as well as reprogrammable devices.

The programmable logic device, as with substantially all integrated circuits, are formed using well known photolithographic processes. As is known in the art, a photolithographic process may be characterized by the smallest geometry that can be repeatedly resolved by that technology. By way of example, some photolithographic processes are capable of resolving geometries as low as 1 micron, whereas other processes are capable of resolving geometries as low as 0.35 microns or smaller.

The capability of conventional photolithographic processes to resolve smaller and smaller geometries provides integrated circuit designers with the capability of designing ever more complex circuits in ever smaller size (i.e., the circuit density increases with the square of the characteristic length of the process). It is therefore highly advantageous to use photolithographic processes capable of resolving the smallest geometries. One advantage to using photolithographic processes capable of producing finer line widths is that more integrated circuits, in the form of die, can be put on a single semiconductor wafer, thereby producing greater yield per wafer with the attendant reduction in manufacturing costs.

However, any integrated circuit having a characteristic length finer than 0.5 microns must use a circuit supply voltage (referred to in some cases as TTL voltage or as VCC) less than 5 volts. This is due primarily to the reduction in breakdown voltages between adjacent structures due to the reduced distances between critical structures in the integrated circuit. Typically, as the geometries the applied supply voltage for integrated circuits with geometries less than 0.5 microns is approximately 3.3 volts.

This change in the supply voltage for integrated circuits produced using different photolithographic processes destroys what heretofore has been transparent to the integrated circuit end user. More particularly, the change from 1.0 micron to 0.65 micron, for example, was transparent to the integrated circuit end user since the TTL voltage is 5 volts for either integrated circuit. However, the same circuit fabricated in a 0.35 micron technology requires a reduction in the supply voltage to approximately 3.3 volts. Thus the change from 0.65 micron device to the same circuit fabricated in 0.35 micron technology requires substantial investment in modifications for the end user or system manufacturer who uses the integrated circuit as a component in a system. Such modifications can include new power supplies, additional power supplies to supply power to devices requiring 5 volts, additional software to support the additional supply voltages, as well as the potential need to re-layout printed circuit boards (PCB), for example, to accommodate the new and/or additional power supplies and supply voltages.

By way of example, FIG. 1 illustrates a conventional printed circuit board (PCB) 100 with a 5 volt power supply 102. As part of the circuit incorporated therein, the PCB 100 includes a programmable logic device (PLD) 104 and a PLD 106 each requiring an operating supply voltage of 5.0 volts. Each of the PLDs 104 and 106 are connected to a configuration memory 108 by way of a configuration bit stream bus 110 arranged to carry a configuration bit stream. The configuration bit stream includes all configuration data stored in the configuration memory 108 required to fit a desired logic and/or memory function in the PLDs 104 and 106. Typically, the configuration memory 108 is a serial memory device in that the configuration data stored therein is supplied to the bus 110 in a serial fashion. The power supply 102 supplies 5 volts to a power supply bus 112 connected to each of the PLDs 104 and 106. In the example shown, since each of the PLDs included in the PCB 100 require 5 volts supply, the power supply bus 112 supplies both PLDs 104 and 106.

Referring now to FIG. 2, a conventional PCB 120 having a PLD 122 a PLD 124 requiring a 3.3 volt power supply and a 5.0 volt power supply, respectively, is shown. The PCB 120 includes a configuration memory 126 connected to the PLD 122 and a PLD 124 by way of a bus 128. Since the PLD 122 requires a 3.3 volt supply while the PLD 124 requires a 5.0 volt power supply, two power supplies 130 and 132 included in the PCB 120 supplies 3.3 volts and 5.0 volts, respectively. The 3.3 volt power supply 130 is connected to PLD 122 by way of a 3.3 volt power supply bus 134 and the 5.5 volt power supply 132 is connected to the PLD 124 by way of a 5.0 volt power supply bus 136.

By requiring the use of two power supplies and two associated power supply busses to accommodate integrated circuits (such as PLDs) having different supply voltages, much valuable PCB real estate is wasted. In addition, the design and layout of the PCB is greatly complicated resulting in increased manufacturing and design costs. This additional cost reduces the incentives to upgrade customers with the latest technologies and results in lower profits and added time to market.

In view of the foregoing, it would be advantageous and therefore desirable to provide a configuration memory used for the programming of a programmable integrated circuit such as a PLD with the capability of providing any number of suitable supply voltages. In this way, any device formed using any photolithographic process can be transparently interchanged without substantial additional cost and use to the end user.

SUMMARY OF THE INVENTION

The present invention relates generally to a programmable voltage regulator used to convert a first voltage to a desired operating voltage. The invention provides for more efficient use of integrated circuits, such as programmable logic devices, fabricated with advanced process technologies.

In one aspect of the invention, a programmable voltage regulator is disclosed. The programmable voltage regulator is arranged to selectively provide a desired operating voltage based upon operating voltage configuration data. The programmable voltage regulator includes an operating voltage decoder arranged to receive and decode selected operating voltage configuration data. The programmable voltage regulator also includes a programmable voltage down converter connected to the operating voltage decoder by way of a data bus. The programmable voltage down converter is arranged to receive a first voltage at an input line and programmably convert the first voltage to the desired operating voltage at an output line based upon the decoded operating voltage configuration data.

In another aspect of the invention, a configuration memory arranged to provide a desired operating voltage to a programmable integrated circuit connected thereto based upon operating voltage configuration data is disclosed. The configuration memory includes a memory array arranged to store programmable integrated circuit (PIC) configuration data used by the programmable integrated circuit to fit a desired logic function, a desired memory function, or a desired logic-memory function. The configuration memory is connected to the programmable integrated circuit by way of a configuration bit stream bus arranged to pass the PIC configuration data from the configuration memory to the programmable integrated circuit and a power supply bus arranged to supply the desired operating voltage to the programmable integrated circuit.

The configuration memory includes an operating voltage configuration data buffer arranged to store the operating voltage configuration data. The configuration memory also includes an operating voltage configuration data decoder connected to the operating voltage configuration data buffer by way of an operating voltage configuration data bus. The operating voltage configuration data decoder is arranged to decode the operating voltage configuration data to form decoded operating voltage configuration data. The configuration memory further includes a programmable voltage down converter (VDC) connected to the operating voltage decoder by way of a data bus. The programmable VDC has a VDC input line connected to a first voltage supply and a VDC output line connected to the power supply bus. The programmable VDC is arranged to provide the desired operating voltage based upon the decoded operating voltage configuration data to the programmable integrated circuit by way of the power supply bus.

In yet another embodiment of the invention, a method of programmably providing appropriate VCCint supply voltages to a selected integrated circuit based upon supply voltage configuration data is disclosed. The selected integrated circuit is connected by way of a power supply bus to a programmable voltage regulator that includes a supply voltage configuration data decoder connected to a programmable voltage down converter by way of a data bus. The programmable voltage down converter has an output line connected to the power supply bus and an input line connected to VCCext voltage supply. The appropriate VCCint supply voltage is provided to the selected integrated circuit by receiving supply voltage configuration data at the supply voltage configuration data decoder. Decoding the supply voltage configuration data to form decoded supply voltage configuration data and passing the decoded supply voltage configuration data to the programmable voltage regulator by way of the data bus. Converting the VCCext supply voltage to the appropriate VCCint supply voltage based upon the decoded supply voltage configuration data, outputting the appropriate VCCint supply voltage to the output line, and supplying the appropriate VCCint supply voltage to the selected integrated circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings, wherein like reference numerals refer to analogous or similar elements to facilitate ease of understanding, and in which.

DETAILED DESCRIPTION OF THE INVENTION

The present invention relates to a configuration memory having a programmable voltage regulator. The invention provides for more efficient use of integrated circuits, such as programmable logic devices, fabricated with advanced process technologies requiring different supply voltages. By providing the capability of transparently substituting integrated circuits with advanced process technologies, the cost of substituting these integrated circuits into established systems such as printed circuit board, for example, is greatly reduced. Efficient retrofitting is particularly advantageous for applications that require large numbers of integrated circuits or for applications where redesign of motherboards, for example, would be prohibitively expensive and/or time consuming.

While the integrated circuit can be of many types, the present invention is well suited for use with a complex programmable logic device (CPLD) requiring a configuration memory device to suitably couple and program various functional blocks included therein. Any number of functional blocks within the CPLD can be coupled and programmed to perform a desired logic and/or memory function by configuration data stored within the configuration memory device.

In the following description, numerous specific details are set forth in order to provide a thorough understanding of the present invention. It will be apparent, however, to one skilled in the art that the present invention may be practiced without some or all of these specific details. In other instances, well known structures or operations have not been described in detail in order to not unnecessarily obscure the invention.

Figure 1:
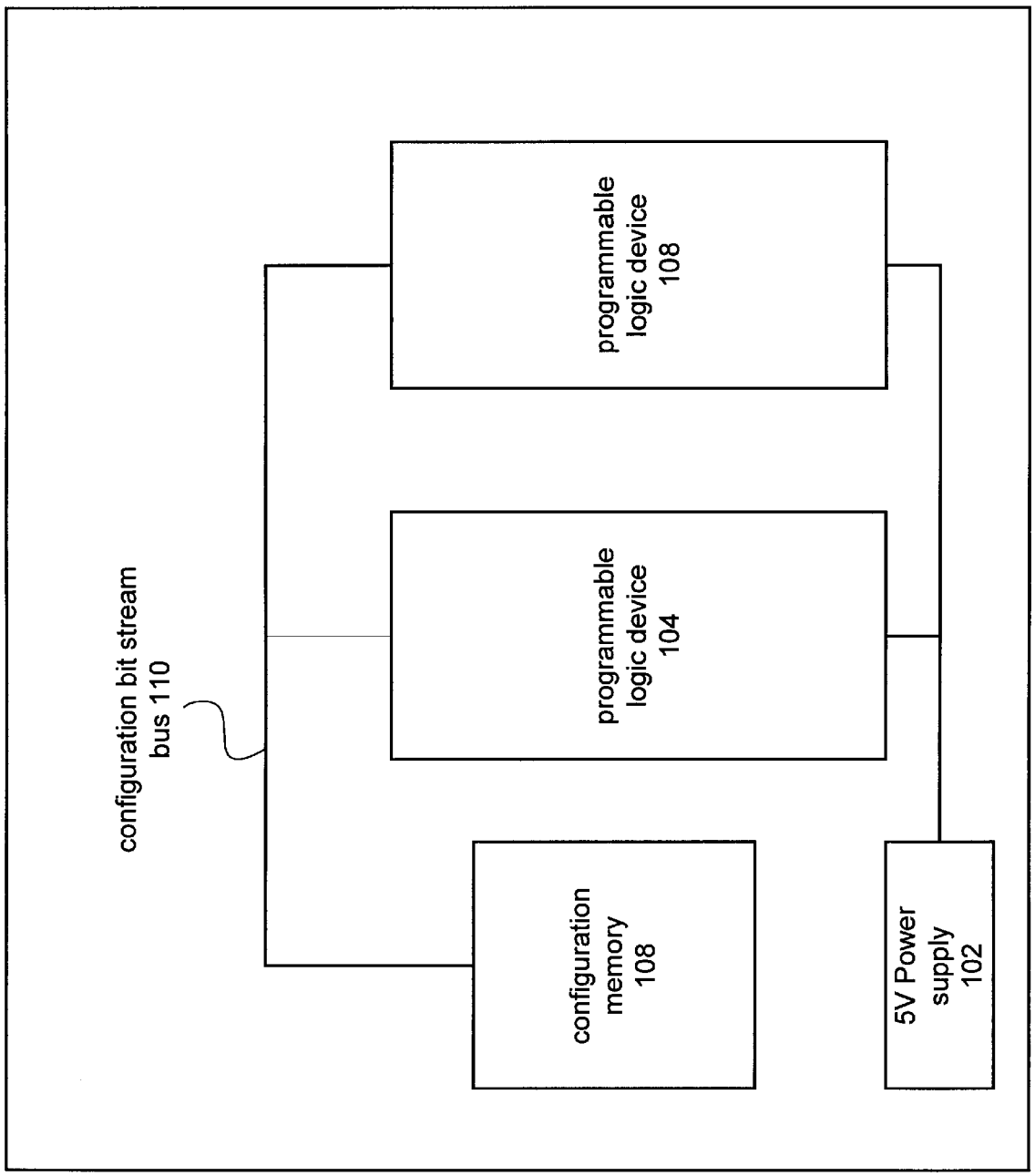
FIG. 1 illustrates a conventional printed circuit board (PCB) with a 5 volt power supply.
Figure 2:
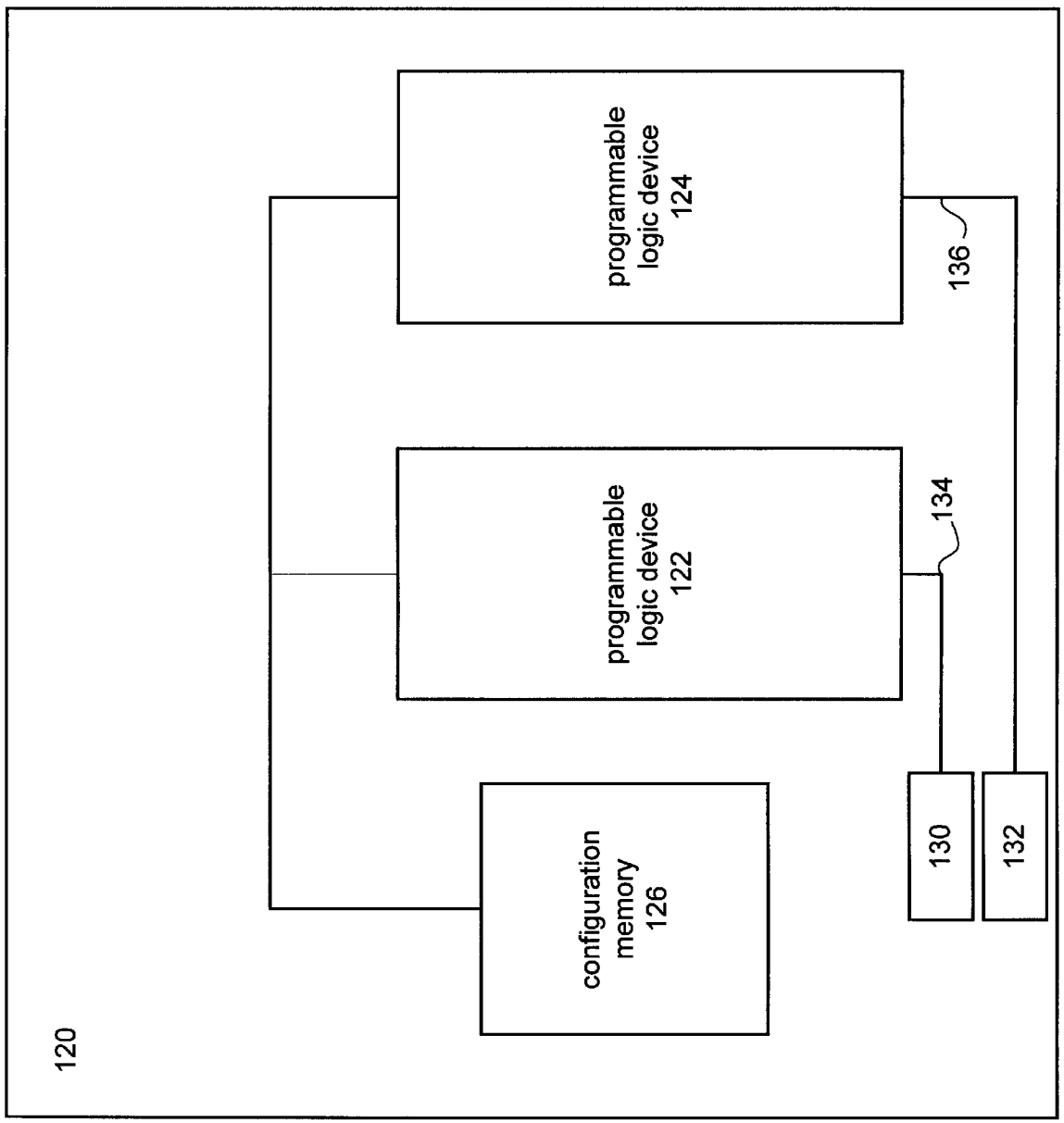
FIG. 2 illustrates a conventional printed circuit board (PCB) having two programmable logic devices each requiring different supply voltages.
Figure 3:
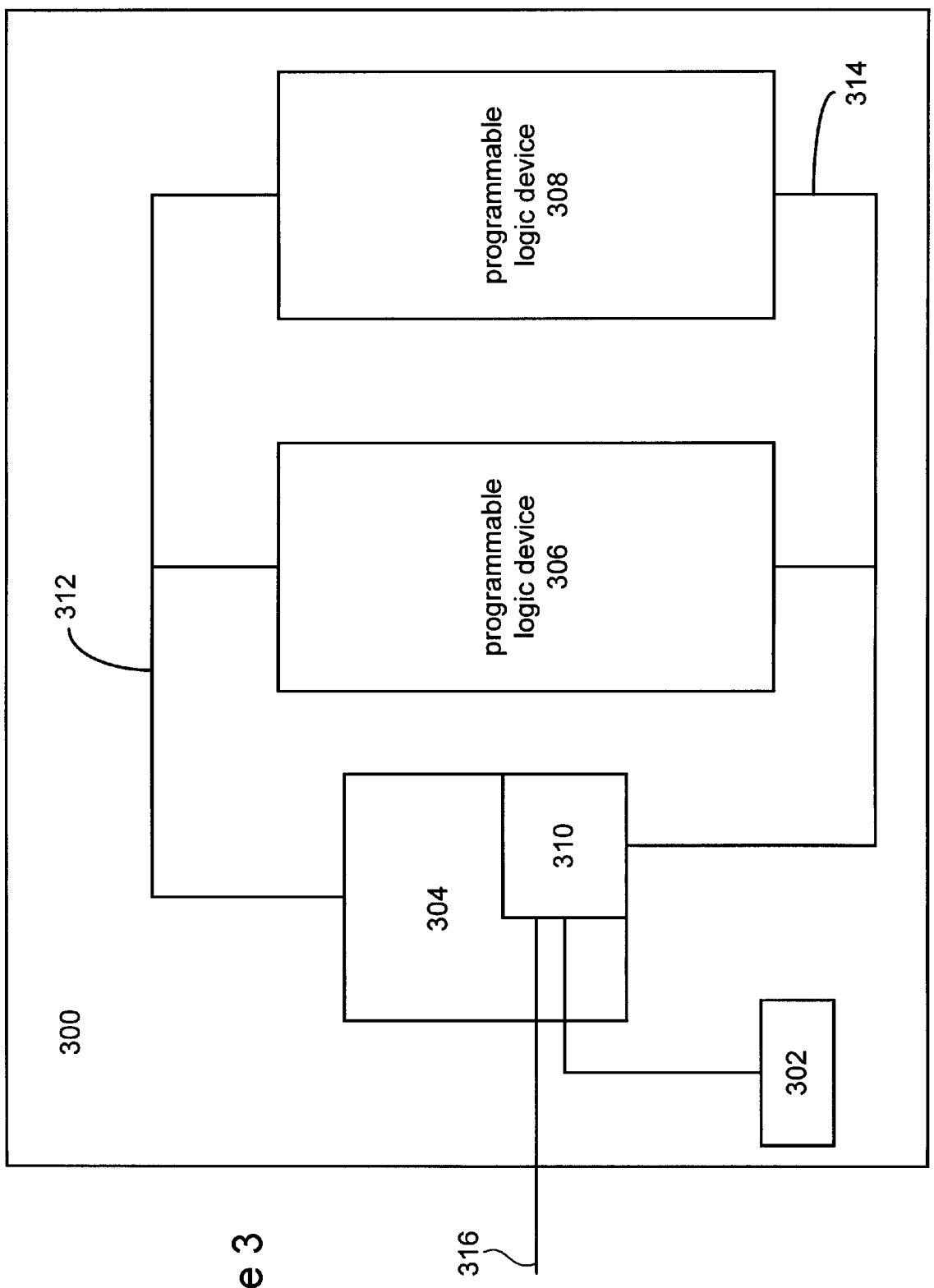
FIG. 3 is a printed circuit board in accordance with an embodiment of the invention.

FIG. 3 is a printed circuit board 300 in accordance with an embodiment of the invention. The printed circuit board 300 includes a power supply 302, a configuration memory 304, and programmable logic devices (PLD) 306 and 308. The configuration memory 304 includes a programmable voltage regulator 310 connected to the power supply 302. In the embodiment illustrated in FIG. 3, the PLDs 306 and 308 are each connected to the configuration memory 304 by way of a configuration bit stream bus 312. The configuration bit stream bus 312 is arranged to carry configuration data stored in the configuration memory 304 that is used by the PLDs 306 and 308 to fit any desired logic and/or memory function. Typically, the configuration memory 304 is a serial memory device capable of supplying the configuration data stored therein to the configuration bit stream bus 312 in a serial fashion. In the described embodiment, one configuration memory device is shown whereas any number of configuration memories may be used as deemed appropriate. By way of example, two or more configuration memory devices may be cascaded in order to store appropriate configuration data of sufficient quantity for any number of programmable logic devices connected thereto.

The printed circuit board 300 also includes a power supply bus 314 connecting each of the PLDs 306 and 308 to the programmable voltage regulator 310 and a select enable line 316 used to carry enable signals to the programmable voltage regulator 310. During operation, the power supply bus 314 carries as many supply voltages as may be generated by the programmable voltage regulator 310 to each of the programmable integrated circuits, such as PLD 306 and 308, included in the PCB 300. It should be noted that programmable logic devices are only one type of programmable integrated circuit that may be used in the printed circuit board 300. It should also be noted, that the programmable voltage regulator 310 is not limited in use to only those programmable type integrated circuits requiring a configuration memory device such as configuration memory 304.

Proper operation of the PCB 300 requires that the PLDs 306 and 308 be configured to perform their respective logic and/or logic-memory functions. In some cases, the PLDs 306 and 308 can be reconfigured "on the fly" such that each or both can be configured to perform their respective functions as needed. In other cases, each or both of the PLDs 306 and 308 can be configured for a one time only application in which case, the configuration memory 304 is used only once.

Typically, the configuration data used by the PLDs 306 and 308 in fitting the desired logic and/or logic-memory functions are stored in the configuration memory 304. In one embodiment, the configuration memory 304 is a non-volatile memory such as an EPROM useful in permanently storing configuration data. Typically, non-volatile memory devices (such as an EPROM) is used for applications that require dedicated functions. Such dedicated function type printed circuit boards can be found, for example, in printers, modems, and the like. In another embodiment, the configuration memory 304 is a volatile memory type device capable of being repeatedly updated with new configuration data. Such volatile memory devices include but are not limited to EEPROMs (electrically erasable EPROM) as well as SRAMs.

In one embodiment, the configuration data included in the configuration memory 304 includes supply voltage configuration data used by the programmable voltage regulator 310 to generate appropriate supply voltages. Once generated, these supply voltages are passed to the power supply bus 314. The power supply bus 314 in turn, connected to each of the integrated circuits, such as PLD 306 and 308, included in the PCB 300. By way of example, using appropriate supply voltage configuration data appropriate to PLD 306 and PLD 308, the programmable voltage regulator 310 supplies PLD 306 with a supply voltage of 3.3 volts, for example, and the PLD 308 with a supply voltage of 5.0 volt by way of the power supply bus 314. In this way, the PCB 300 is capable of accommodating any number of integrated circuits, such as PLDs, requiring different supply voltages without extensive rewiring or circuit board redesign. In addition, since the programmable voltage regulator 310 is programmable in nature, the supply voltages can be changed as required by the application for which the PCB 300 is being used.

Figure 4:
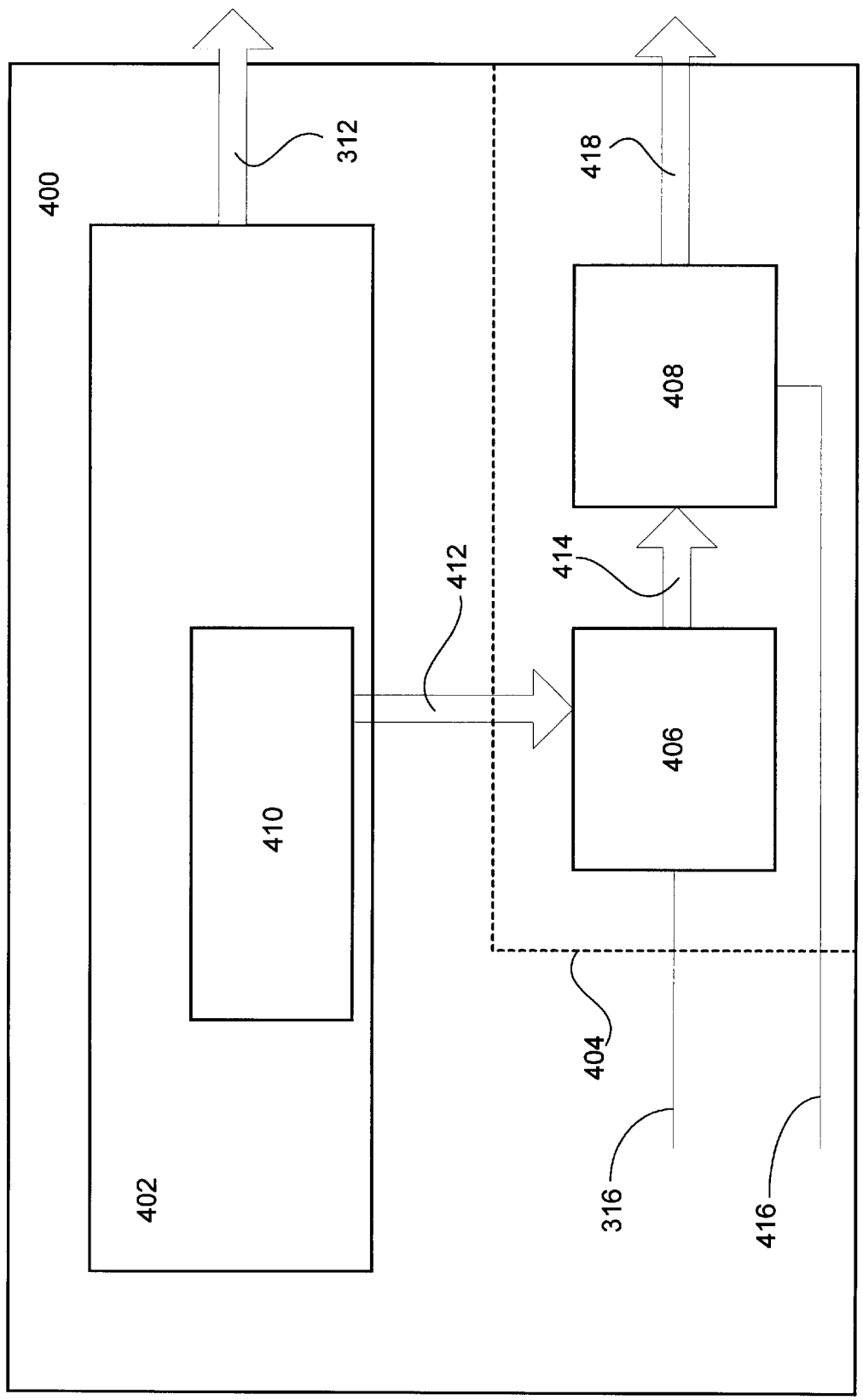
FIG. 4 is a block diagram of a configuration memory in accordance with an embodiment of the invention.

FIG. 4 is a block diagram of a configuration memory 400 in accordance with an embodiment of the invention. It should be noted that the configuration memory 400 is but one implementation of the configuration memory 304 shown in FIG. 3. Accordingly, the configuration memory 400 will be described with reference to components heretofore described in FIG. 3. The configuration memory 400 includes a configuration memory array 402 and a programmable voltage regulator 404. It should be noted that the programmable voltage regulator 404 is one embodiment of the programmable voltage regulator 310 shown in FIG. 3.

The configuration memory array 402 is arranged to store configuration data used by programmable type integrated circuits connected thereto. The programmable voltage regulator 404 includes a supply voltage decoder 406 connected to a programmable voltage down converter 408.

The configuration memory 400 also includes a supply voltage configuration data buffer 410 arranged to store supply voltage configuration data. In one embodiment of the invention, the supply voltage configuration data takes the form of data words each being associated with a particular integrated circuit such as a programmable logic device connected to the configuration memory 400. The supply voltage configuration data stored in the supply voltage configuration data buffer 410 can be used by the programmable voltage regulator 404 to supply a specific supply voltage to a particular programmable logic device connected to the configuration memory 400. In this way, the configuration memory 400 is capable of supplying as many different supply voltages as may be required.

Typically, the supply voltage configuration data is stored in the supply voltage configuration data buffer 410 prior to the start of the programmable logic device configuration procedure. However, one skilled in the art can readily appreciate the fact that the configuration data can be supplied to the supply voltage configuration data buffer 410 at any appropriate time prior to or during the actual configuration procedure. Applications that would find this capability of particular value include reconfigurable computers.

In one implementation of the invention, the supply voltage configuration data buffer 410 is formed by allocating a portion of the configuration memory array 402 not used to store configuration data. Supply voltage configuration data can then be received from an external source and stored in the supply voltage configuration data buffer 410 using, for example, software control. In this way, the supply voltage configuration data can be dynamically allocated in the configuration memory array 402 as needed. This arrangement is useful in applications where the number of programmable logic devices being configured by the configuration memory 400 is not static. Such applications include, but are not limited to, reconfigurable computing applications which typically utilize a number of different programmable logic devices each of which may require different supply voltages.

In another implementation of the invention, the supply voltage configuration data buffer 410 can be a separate data register coupled to an input line (not shown) arranged to carry supply voltage configuration data from an external source. By using a separate data register to store configuration data, the configuration memory array 402 can be a dedicated memory array for storing configuration data only, for example.

Still referring to FIG. 4, the supply voltage configuration buffer 410 is connected to the supply voltage decoder 406 by way of a supply voltage configuration data bus 412. The supply voltage configuration data bus 412 is arranged to carry supply voltage configuration data to the supply voltage decoder 406. In the described embodiment, the supply voltage configuration data is stored in and supplied by the supply voltage configuration data buffer 410. In a preferred embodiment of the invention, the supply voltage decoder 406 is connected to the programmable voltage down converter 408 by a selector bus 414 arranged to carry decoded supply voltage select data words. Such decoded supply voltage select words are those supply voltage configuration data words decoded by the supply voltage decoder 406 and passed to the programmable voltage down converter 408.

In a preferred embodiment of the invention, the programmable voltage down converter 408 is connected to the board power supply bus 416 while the board power supply bus 416 is connected to an external power supply that supplies a single voltage referred to as VCCext. Typically, VCCext is 5.0 volts but can in fact be any reference voltage deemed appropriate. Using the decoded supply voltage select data words decoded by the supply voltage decoder 406, the programmable voltage down converter 408 provides a specific supply voltage VCCint to a particular programmable logic device by way of a power supply bus 418. In this way, a single power supply connected to board power supply bus 416 can be used to provide all integrated circuits, including programmable logic devices, connected to the configuration memory 400 and power supply bus 418 with their respective supply voltages.

Figure 5:
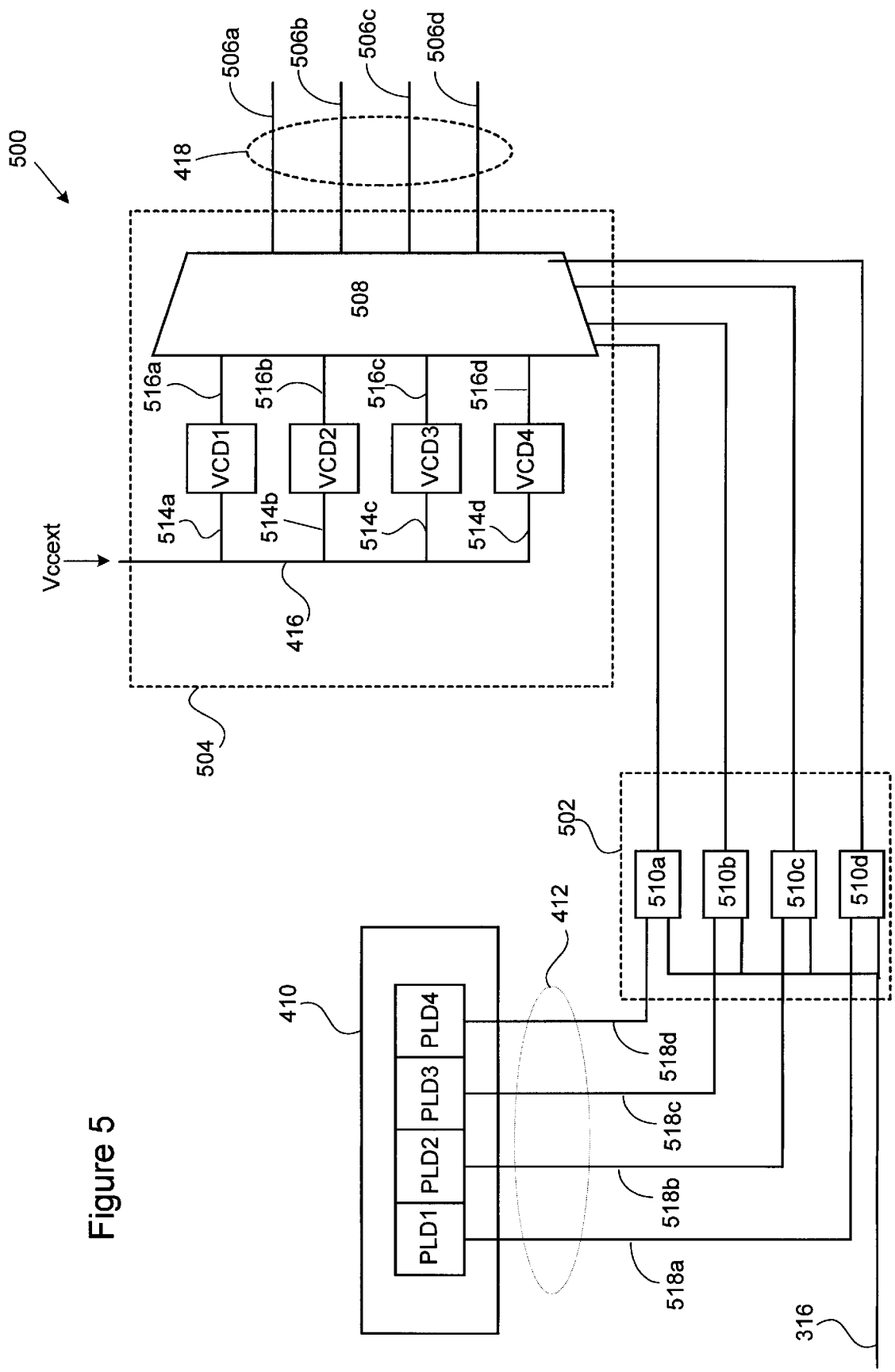
FIG. 5 is a schematic illustration of a programmable voltage down converter in accordance with an embodiment of the invention.

FIG. 5 is a schematic illustration of programmable voltage regulator 500 in accordance with an embodiment of the invention. It should be noted that the programmable voltage regulator 500 is one embodiment of the programmable voltage regulator 404 shown in FIG. 4. The programmable voltage regulator 500 includes a supply voltage decoder 502 and a programmable voltage down converter 504 having power pins 506a through 506d. In a preferred embodiment of the invention, the supply voltage decoder 502 includes decoders 510a through 510d. The decoders 510a through 510d are each connected to a selector unit 508 included in the programmable voltage down converter 504. In one implementation of the invention, signal lines 512a through 512d are included in the selector bus 404 and provide signal paths between the decoders 510a through 510d and the selector 508, respectively. In the described embodiment, the select enable line 316 connected to decoders 510a through 510d is arranged to supply a decoder enable signal to each of the decoder units connected thereto.

In a preferred embodiment of the invention, the programmable voltage down converter 504 includes voltage down converters $VCD_1$ through $VCD_4$ each having the board power supply bus 416 connected to input lines 514a through 514d, respectively. The voltage down converters $VCD_1$ through $VCD_4$ are each arranged to use the received external supply voltage VCCext to generate and output a predetermined internal power supply voltage $VCCint_1$ through $VCCint_4$ to output lines 516a through 516d, respectively.

The output lines 516a through 516d in turn form inputs to the selector unit 508. The selector unit 508 is arranged to use the decoded select words generated by the decoders 510a through 510d to couple particular ones of the selector unit input lines 514a through 514d to selected ones of the power pins 506a through 506d.

In a preferred embodiment of the invention, each of the power pins 506a through 506d is included in the power supply bus 418 and is connected to a particular programmable logic device included in the PCB 300. In this way, the programmable voltage regulator 500 can supply any combination of any preselected supply voltages VCCint to any integrated circuit connected to the power supply bus 418.

In one embodiment of the invention, the supply voltage configuration buffer 410 includes data registers $PLD_1$–$PLD_4$ used to store supply voltage configuration data associated with each of programmable logic devices PLD1–PLD4 (not shown) connected to the configuration memory 400. The data registers $PLD_1$–$PLD_4$ communicate with the decoders 510a through 510d by way of input lines 518a through 518d, respectively, included in the bus 412. During operation, each of the data registers $PLD_1$–$PLD_4$ that contains supply voltage configuration data uses its respective input line to communicate with its respect decoder. Only when supplied with a decoder enable signal, the enabled ones of decoders 510a through 510d generate an associated decoded select word based upon supply voltage configuration data received from data registers $PLD_1$–$PLD_4$. The decoded select words are then passed by the signal lines 510a through 510d to the selector unit 508.

In one embodiment of the invention, the selector unit 508 can be an N×M cross bar switch, for example, capable of programmably connecting any of N inputs to any of M outputs. The selector unit 508 then uses the received decoded select words to couple any of the input lines 516a–516d to any power pins 506a through 506d. As described above, each of the input lines 516a–516d is connected to a particular voltage down converter VCD generating a predetermined VCCint.

If desired, the contents of the data registers $PLD_1$–$PLD_4$ can be updated as needed at which time the above described procedure can be repeated as many times as may be required. In addition, any number of voltage down converters can be included in the programmable voltage regulator 500 consistent with a desired range of supply voltages.

Figure 6:
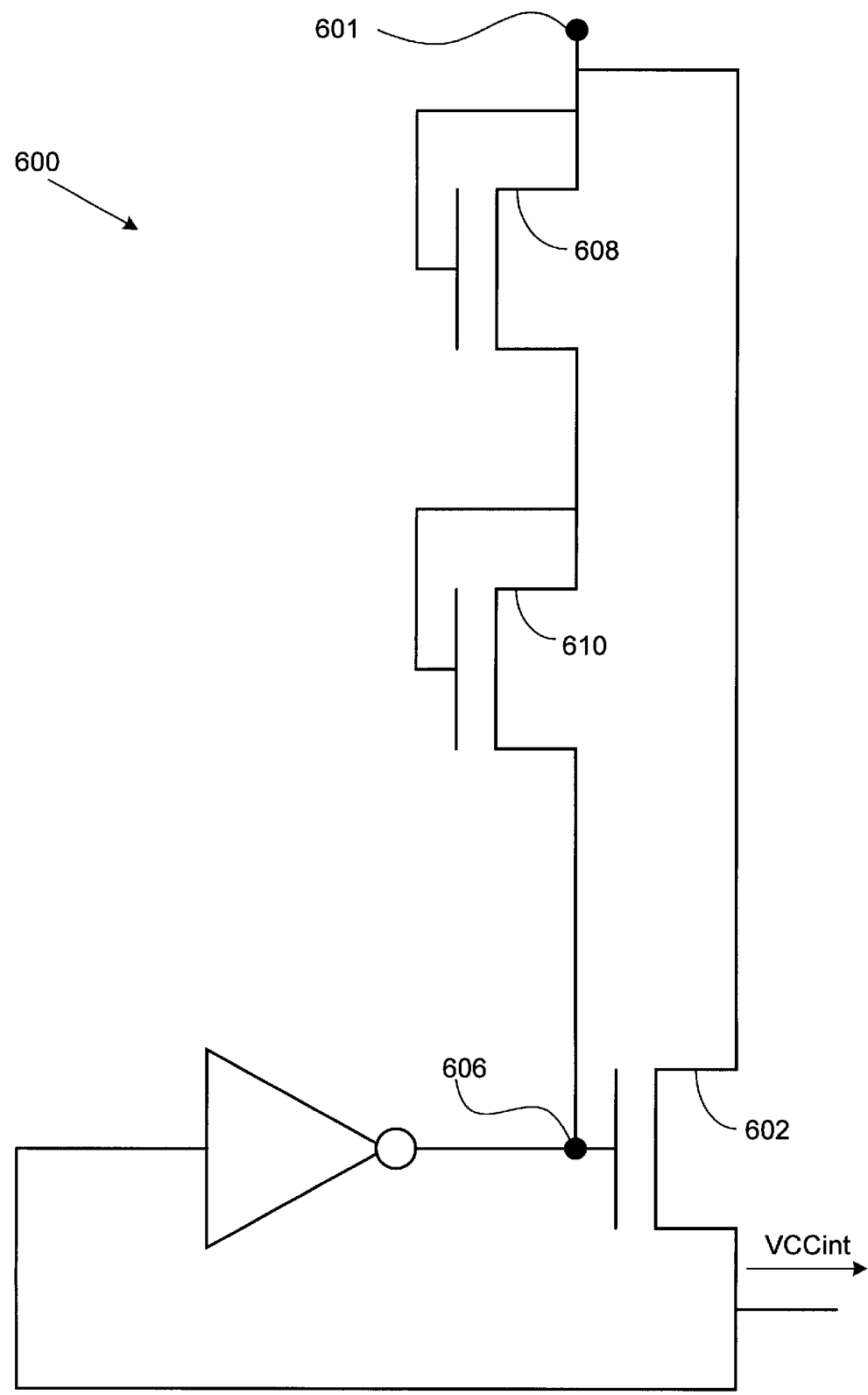
FIG. 6 is a schematic illustration of an implementation of a voltage down converter unit.

FIG. 6 is a voltage down converter circuit 600 in accordance with one embodiment of the invention. The voltage down converter 600 is also described in Patel et al U.S. patent application Ser. No. 08/863,876 filed May 27, 1997 and incorporated by reference in its entirety. The voltage down converter circuit 600 converts VCCext into VCCint used by the internal circuitry of integrated circuits. The voltage down converter 600 includes a transistor 602 coupled between VCCext and VCCint. VCCint is in turn coupled to an inverting amplifier 604 which in turn is connected to a control node 606 of the transistor 602. Node 606 is clamped to VCCext using two diode connected transistors 608 and 610. It should be noted that transistors 608 and 610 can be substituted with diodes or other similar voltage clamping devices. Transistors 608 and 610 operate to maintain node 606 within about two threshold voltages (VTN) of VCCext. In this case, when for example VCCext is approximately 5.0 volts, the voltage level at node 606 is about 3.4 volts which is relatively close to a desired VCCint of 3.3 volts, for example, allowing for faster response time for the inverting amplifier 604 to adjust for fluctuations in the voltages.

It should be noted that depending upon the technology that determines the voltage drop per voltage clamp, and the design criteria, there may be more or fewer than two voltage clamps used. By way of example, if a lower value of VCCint is desired, the voltage down converter 600 can include voltage clamps in addition to those shown in FIG. 6. In a similar manner, if a higher VCCint is desired, then fewer voltage clamps, or voltage clamps having different voltage drops can be used.

Figure 7:
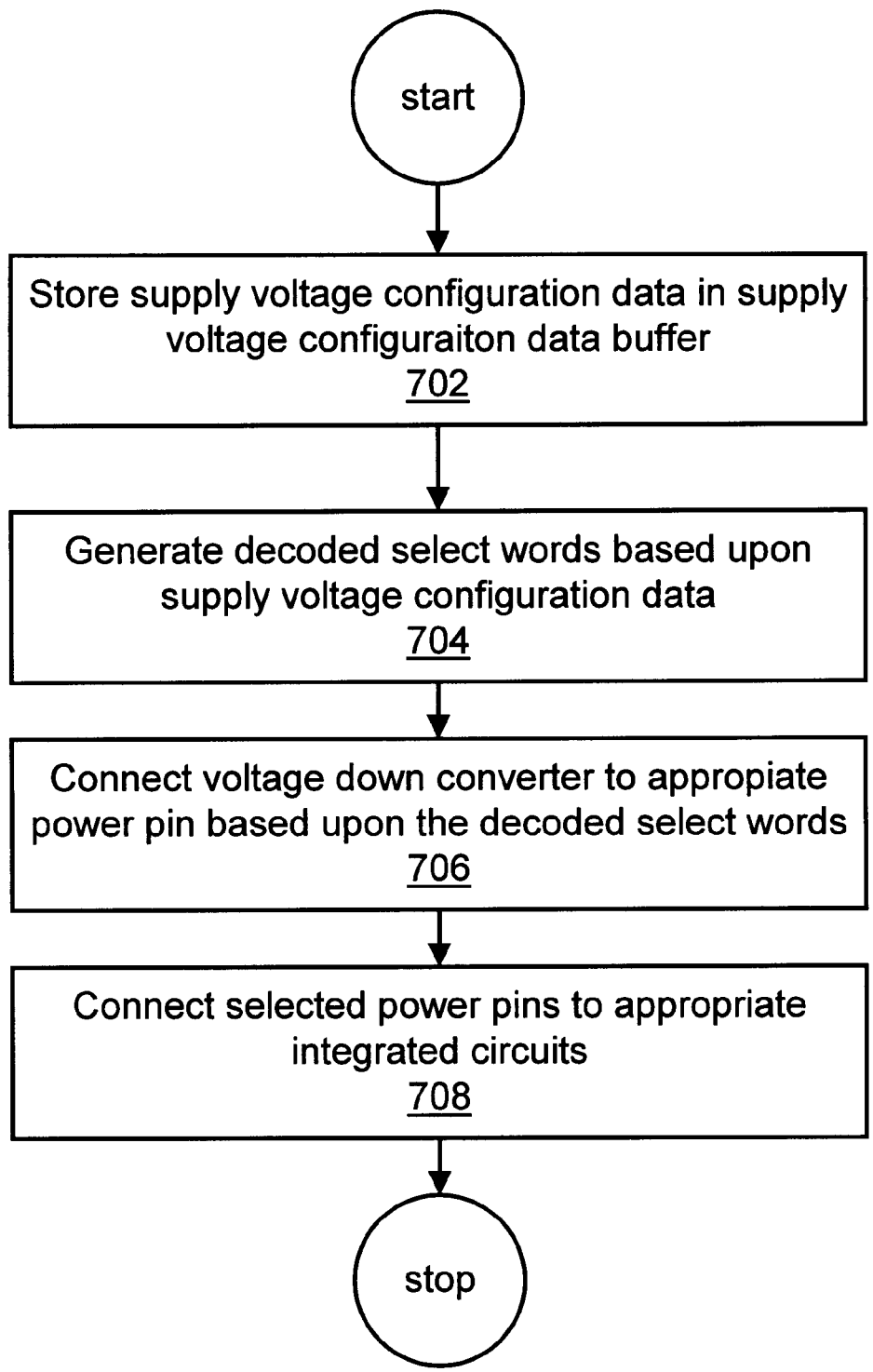
FIG. 7 is a flowchart detailing the operation of the programmable voltage down converter in accordance with an embodiment of the invention.

FIG. 7 is a flowchart detailing the use of programmable voltage regulator 600 in accordance with an embodiment of the invention. The programmable voltage regulator 600 generates supply voltages VCCint for integrated circuits connected to a configuration memory. The configuration memory includes a configuration memory array arranged to store configuration data as well as a supply voltage configuration data buffer used to store supply voltage configuration data associated with each integrated circuit connected to the configuration memory.

The supply voltage configuration data is stored in the supply voltage configuration data buffer 702. The supply voltage configuration data is then decoded by decoder units to form decoded select words 704. The decoded select words are then used by a selector unit to connect voltage down converters to selected power pins 706. The power pins in turn supply appropriate supply voltages to selected integrated circuits in accordance with the supply voltage configuration data 708.

The invention has numerous advantages. One advantage of the invention is that an integrated circuit manufacturer is able to substitute integrated circuits processed using advanced technologies without additional time and expense of retrofitting to existing systems. As a result, the integrated circuit manufacturer is able to reduce costs without forcing end users to undergo expensive and time consuming retrofits thereby encouraging the use of advanced process technologies. Another advantage relates to the capability of the invention to provide any number of different supply voltages as needed to any number of integrated circuits. As a result, the invention allows for simplified design and layout of circuit boards used in such applications as reconfigurable computing. This simplification substantially increases the flexibility in design and layout for systems requiring CPLDs having different supply voltage requirements.

Although the foregoing invention has been described in some detail for purposes of clarity of understanding, it will be apparent that certain changes and modifications may be practiced within the scope of the appended claims. It should be noted that there are alternative ways of implementing the present invention. It is therefore intended that the following appended claims be interpreted as including all such alterations, permutations, and equivalents as fall within the spirit and scope of the present invention.

What is claimed is:

1. A programmable voltage converter arranged to selectively provide a desired operating voltage based upon operating voltage configuration data, comprising:

an operating voltage decoder arranged to receive and decode selected operating voltage configuration data; and a programmable voltage down converter connected to the operating voltage decoder by way of a data bus, the programmable voltage down converter arranged to receive a first voltage at an input line and programmably generate using the first voltage the desired operating voltage at an output line based upon the decoded operating voltage configuration data.

2. A programmable voltage converter as recited in claim 1, wherein the programmable voltage down converter includes:

a first voltage down converter (VDC) circuit arranged to convert the first voltage received at a first VDC input line to a first operating voltage at a first VDC output line;

a second voltage down converter (VDC) circuit arranged to convert the first voltage received at a second VDC input line to a second operating voltage at a second VDC output line;

a selector connected to the data bus having a selector first input line, a selector second input line, a selector first output line, and a selector second output line, the selector first input line being connected to the first VDC output line and the selector second input line being connected to the second VDC output line, the selector being arranged to electrically couple the selector first input line and the selector second input line to selected ones of a group consisting of the selector first output line and the selector second output line based upon the decoded operating voltage configuration data.

3. A programmable voltage converter as recited in claim 2, wherein the coupled selector first output line and the coupled selector second output line are connected to a first power line and a second power line, respectively.

4. A programmable voltage converter as recited in claim 3, wherein the operating voltage decoder includes:

a decoder unit connected to the data bus arranged to decode the operating voltage configuration data to form a decoded operating voltage configuration data word; and a select enable line connected to the decoder unit arranged to provide a decoder select signal used to enable the decoder unit.

5. A programmable voltage converter as recited in claim 4, wherein said voltage down converter circuit includes:

a conversion transistor coupled between a VCCext voltage supply and a VCCint voltage supply; and an amplifier coupled to receive the VCCint voltage supply and feedback a control signal to the conversion transistor, thereby regulating an output of the conversion transistor.

6. A configuration memory arranged to provide a desired operating voltage to a programmable integrated circuit connected thereto based upon operating voltage configuration data, comprising:

an operating voltage configuration data buffer arranged to store the operating voltage configuration data;

a programmable voltage-down converter as claimed in claim 1; and a select enable line connected to the programmable voltage-down converter arranged to provide an enable signal.

7. A configuration memory arranged to provide a desired operating voltage to a programmable integrated circuit connected thereto based upon operating voltage configuration data, the configuration memory also includes a memory array arranged to store programmable integrated circuit (PIC) configuration data used by the programmable integrated circuit to fit a desired logic function, a desired memory function, or a desired logic-memory function, the configuration memory is connected to the programmable integrated circuit by way of a configuration bit stream bus arranged to pass the PIC configuration data from the configuration memory to the programmable integrated circuit and a power supply bus arranged to supply the desired operating voltage, comprising:

an operating voltage configuration data buffer arranged to store the operating voltage configuration data;

an operating voltage decoder connected to the operating voltage configuration data buffer by way of an operating voltage configuration data bus arranged to decode the operating voltage configuration data to form decoded operating voltage configuration data;

a select enable line connected to the operating voltage decoder arranged to provide a decoder enable signal; and a programmable voltage down converter (VDC) connected to the operating voltage decoder by way of a data bus, the programmable VDC having a VDC input line connected to a first voltage supply and a VDC output line connected to the power supply bus, the programmable VDC being arranged to receive a first voltage at the VDC input line and programmably convert the first voltage to the desired operating voltage at an output line based upon the decoded operating voltage configuration data, the desired operating voltage being supplied in turn to the programmable integrated circuit by way of the power supply bus.

8. A configuration memory as recited in claim 7, wherein the programmable voltage down converter includes:

a conversion transistor coupled between a VCCext voltage supply and a VCCint voltage supply; and an amplifier coupled to receive the VCCint voltage supply and feedback a control signal to the conversion transistor, thereby regulating an output of the conversion transistor.

9. A configuration memory as recited in claim 7 wherein the programmable integrated circuit is a programmable logic device.

10. A configuration memory as recited in claim 7, wherein the memory array is a non-volatile memory array.

11. A configuration memory as recited in claim 7, wherein the memory array is a volatile memory array.

12. A method of programmably providing appropriate VCCint supply voltages to a selected integrated circuit connected by way of a power supply bus to a programmable voltage regulator based upon supply voltage configuration data, the programmable voltage regulator includes a supply voltage configuration data decoder connected to a programmable voltage down converter by way of a data bus, the programmable voltage down converter having an output line connected to the power supply bus and an input line connected to VCCext voltage supply, comprising:

receiving supply voltage configuration data at the supply voltage configuration data decoder;

decoding the supply voltage configuration data to form decoded supply voltage configuration data;

converting the VCCext supply voltage to the appropriate VCCint supply voltage based upon the decoded supply voltage configuration data;

outputting the appropriate VCCint supply voltage to the output line; and supplying the appropriate VCCint supply voltage to the selected integrated circuit.

13. A method as recited in claim 12, wherein the programmable voltage down converter includes:

a conversion transistor coupled between a VCCext voltage supply and a VCCint voltage supply; and an amplifier coupled to receive the VCCint voltage supply and feedback a control signal to the conversion transistor, thereby regulating an output of the conversion transistor.

14. A circuit board for connecting to an external voltage supply the circuit board being arranged to programmably provide desired operating supply voltages to each of a plurality of integrated circuits on the circuit board based upon operating supply voltage configuration data associated with each of the plurality of integrated circuits, the circuit board comprising;

an internal power supply bus for connecting to each of the plurality of integrated circuits;

an external power supply bus arranged to carry an external voltage provided by an external voltage supply; and a programmable voltage regulator connected to the external power supply bus and the internal power supply bus, the programmable voltage regulator being arranged to programmably provide the desired operating supply voltages to each of the integrated circuits by way of the internal power supply bus, wherein the programmable voltage regulator uses the supply voltage configuration data associated with each of the plurality of integrated circuits to convert the external voltage to the desired operating supply voltages.

15. A circuit board as recited in claim 14, wherein the programmable voltage regulator includes:

an operating voltage decoder arranged to decode the operating voltage configuration data to form decoded operating voltage configuration data;

a select enable line connected to the operating voltage decoder arranged to provide a decoder enable signal; and a programmable voltage down converter (VDC) connected to the operating voltage decoder by way of a data bus, the programmable VDC having a VDC input line connected the external voltage supply bus and a VDC output line connected to the internal power supply bus, the programmable VDC being arranged to receive the external voltage at the VDC input line and programmably convert the external voltage to desired operating voltages at an output line based upon the decoded operating voltage configuration data.

16. A circuit board as recited in claim 15, wherein the VCD includes:

a conversion transistor coupled between the external voltage supply bus and the internal voltage supply bus; and an amplifier coupled to receive an internal voltage and feedback a control signal to the conversion transistor, thereby regulating an output of the conversion transistor.

17. A circuit board as recited in claim 14, wherein the plurality of integrated circuits includes a programmable logic device.

* * * * *